United States Patent [19]

Smith et al.

[11] Patent Number: 4,809,256
[45] Date of Patent: Feb. 28, 1989

[54] OPTICAL DEMULTIPLEXER

[75] Inventors: David R. Smith, Woodbridge; Raymond C. Hooper, Ipswich; both of England

[73] Assignee: British Telecommunications public limited company, United Kingdom

[21] Appl. No.: 928,273

[22] PCT Filed: Mar. 6, 1986

[86] PCT No.: PCT/GB86/00127
§ 371 Date: Dec. 11, 1986
§ 102(e) Date: Dec. 11, 1986

[87] PCT Pub. No.: WO86/05342
PCT Pub. Date: Sep. 12, 1986

[30] Foreign Application Priority Data

Mar. 7, 1985 [GB] United Kingdom ......... 8505940
Apr. 18, 1985 [GB] United Kingdom ......... 8509983
Apr. 18, 1985 [GB] United Kingdom ......... 8509984

[51] Int. Cl.$^4$ ............................................. H04B 9/00
[52] U.S. Cl. ................................... 370/4; 350/96.13; 370/1
[58] Field of Search ............... 370/1, 4; 350/96.13, 350/96.14

[56] References Cited

U.S. PATENT DOCUMENTS

| | | | |
|---|---|---|---|
| 3,521,068 | 7/1970 | Armstrong | 250/199 |
| 4,020,282 | 4/1977 | Halpern | 340/347 DD |
| 4,227,175 | 10/1980 | Newman | 340/146.2 |
| 4,507,776 | 3/1985 | Smith | 370/4 |
| 4,608,682 | 8/1986 | Nagashima et al. | 370/4 |

FOREIGN PATENT DOCUMENTS

| | | |
|---|---|---|
| 1261908 | 2/1968 | Fed. Rep. of Germany ........ 370/4 |
| 2540796 | 4/1976 | Fed. Rep. of Germany . |
| 2450539 | 2/1979 | France . |
| 53-20702 | 2/1978 | Japan ........................ 370/4 |
| 1540907 | 2/1979 | United Kingdom . |
| 2065055 | 7/1981 | United Kingdom . |
| 85/04064 | 9/1985 | World Int. Prop. O. . |

OTHER PUBLICATIONS

Callahan-Optical Delay Line Compressor-IBM Tech. Discl. Bulletin-vol. 14 #8 Dec. 1971-pp. 2208-2209.
Haga et al.-An Integrated 1x4 High-Speed Optical Switch-Jour. of Lightwave Tech. vol. LT3 No. 1 Feb. 1985 pp. 116-120.
Kinsel-Wide Band Optical Communication Systems-Proc. of IEEE vol. 58 #10 Oct. 1970 pp. 1666-1683.
Kinsel et al-Terminals For A High Speed Optical PCM Communication System II Proc. of IEEE vol. 56 #2 Feb. 1968 pp. 146-152.
Journal of Lightwave Technology, vol. LT-3, No. 1, Feb. 1985, H. Haga: pp. 116-120, see pp. 117, 118, paragraph III, figure 5.
IEEE Transactions on Microwave Theory and Techniques, vol. MTT-30, No. 10, Oct. 1982, New York, M. Kondo et al, pp. 1747-1753, see figure 1.
IBM Technical Disclosure Bulletin, vol. 24, No. 5, Oct. 1981, New York, M. Thewalt, see p. 2474, lines 1-p. 2475, line 7.
IEEE Journal of Lightwave Technology, vol. LT-3, No. 1, Feb. 1985, N.Y. Korotky et al, pp. 1-6, see p. 4, paragraph "Time-division multiplexing".
IEEE Transactions on Microwave Theory and Techniques, vol. MTT-30, Oct. 1982, N.Y., M. Kondo et al, pp. 1747-1753, see figure 1.
Optical & Quantum Electronics, vol. 12, No. 1, Jan., 1980, pp. 91-93, Chapman and Hall Ltd., London, GB, R. Petrovic.
Electronics Letters, vol. 19, No. 9, 28th Apr. 1983, pp. 323-324, Hitchin, Herts, GB, K. A. Schouhamer Immink.

Primary Examiner—Robert L. Griffin
Assistant Examiner—Leslie Van Beek
Attorney, Agent, or Firm—Nixon & Vanderhye

[57] ABSTRACT

A method and system for demultiplexing an optical signal having a bit rate in the order of GBit/second. The system comprising optical demultiplexing means including delay units and sampling devices such as optical modulators which are controlled at the Bit Rate so that the output signals of the optical modulators correspond to respective ones of the four channels of the original multiplexed signal. These demultiplexed signals may then be converted by regenerators into corresponding electrical signals.

8 Claims, 1 Drawing Sheet

DE-MULTIPLEXER

R - Receiver and Regenerator

RECEIVE DIS-INTERLEAVER

OPTICAL DEMULTIPLEXER

FIELD OF THE INVENTION

The use of optical signals to transmit information is becoming much more common and these optical signals are capable of carrying in multiplexed form information from a plurality of sources.

BACKGROUND AND SUMMARY OF THE INVENTION

This use of optical signals opens up possibilities for sending information at GBit/second rates but this leads to a problem in that current electronic logic is not yet available to separate an incoming optical signal at these bit rates into its component channels.

In accordance with one aspect of the present invention, an optical signal processing system comprises optical demultiplexing means for demultiplexing an n channel time division multiplexed optical input signal to generate n subsidiary optical signals, one for each channel and further comprises a clock signal generator for generating a clock signal with a frequency (B) related to the bit rate of the optical input signal; n optical sampling devices; an optical splitter optically coupled with the optical sampling devices for feeding the optical input signal in parallel to each of the n sampling devices; control means responsive to the clock signal for regularly actuating the sampling devices to pass samples of the optical input signal which constitute the subsidiary optical signals; and delay means whereby the delay means causes the subsidiary optical signals to correspond with respective ones of the n channels.

Preferably the delay means are arranged to enable all channels to be sampled simultaneously.

The system may further comprise n conversion means for converting the subsidiary optical signals into corresponding electrical signals. The conversion means may comprise conventional regenerators.

Where conversion means are provided, the n optical sampling devices will be optically coupled with respective ones of the conversion means.

The optical sampling devices may conveniently comprise optical signal modulators such as electro-optic modulators.

The delay means preferably comprises optical delay means. For example, the delay means may be positioned between the optical splitter and the n optical sampling devices to impart different delays to those portions of the optical input signal fed to at least n-1 of the optical sampling devices so that the optical sampling devices can be sampled simultaneously by the control means the delays being chosen such that the portion of each signal which is passed through the sampling devices corresponds to a respective channel. The delay means may for example be provided by different lengths of optical waveguide (such as optical fibre) between the optical splitter and the sampling devices.

In an alternative arrangement, the delay means is non-optical and may be arranged to cause the control means to actuate the sampling devices in succession whereby the optical signals fed to the optical sampling devices are successively sampled.

The delays imparted by the delay means will typically be integral multiples (not necessarily equally spaced) of a time T, where the bit rate of the multiplexed input signal 1/T bit/second.

Preferably, where conversion means is provided the clock signal generator feeds the clock signal to a divide-by-n circuit having an output connected with the conversion means.

Preferably, the clock signal generator is responsive to the optical input signal to determine the bit rate of the optical input signal and to generate a corresponding clock signal.

In accordance with another aspect of the present invention, an optical signal processing system comprises optical demultiplexing means for demultiplexing a 2 channel time division multiplexed optical input signal to generate 2 subsidiary optical signals, one for each channel wherein the demultiplexing means comprise a clock signal generator for generating a clock signal with a frequency related to the bit rate of the optical input signal; and first coupling means having an input port for receiving the optical input signal and first and second output ports, the coupling means being responsive to the clock signal to connect the input port alternately with the first and second output ports.

It should be understood in this context that by "channel" we include the possibility of there being subsidiary channels within a particular channel. In this situation further coupling means may be connected to each of the output ports of the first coupling means as required to achieve full demultiplexing.

BRIEF DESCRIPTION OF THE DRAWINGS

Two examples of optical signal processing systems according to the invention will now be described with reference to the accompanying drawings, in which.

DETAILED DESCRIPTION

Figure 1:
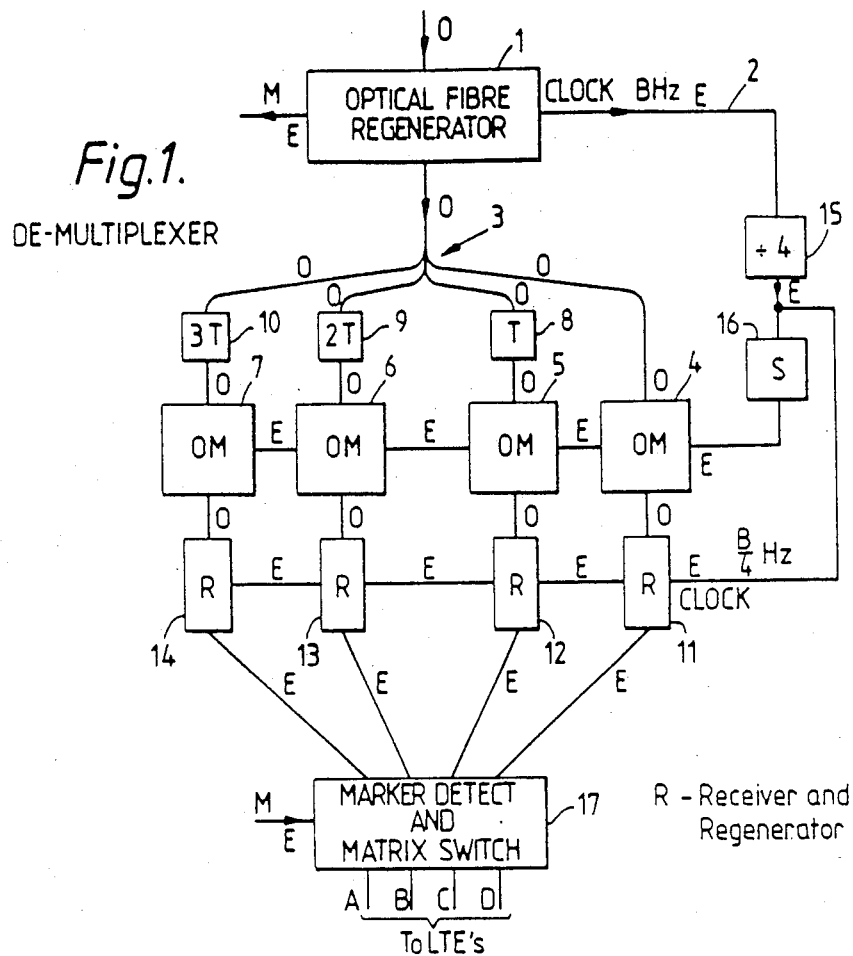
FIG. 1 is a schematic block diagram of a first example.

The system shown in FIG. 1 comprises an optical fibre regenerator 1 to which an incoming optical signal is fed. In this example, it will be assumed that the optical input signal carries four channels at a bit rate of B bits/second. The optical fibre regenerator 1 monitors the incoming signal and generates an electrical clock signal with frequency BHz on a line 2. The regenerator 1 also extracts a marker which will be described below.

The incoming optical signal is then passed via optical fibre to a four way optical splitter 3 which feeds the optical signal in parallel to four electro-optic modulators 4-7. Conveniently, the optical signals are guided along optical fibres such as monomode optical fibres. The modulators could be fabricated on a single substrate of appropriate electro-optical material such as lithium niobate, GaInAsP and the like.

Delay units 8-10 are positioned between the optical splitter 3 and the modulators 5-7 respectively. The delay units 8-10 imparts delays of T, 2T, and 3T on the optical signals passing through them so that at any instant different portions of the optical input signal are applied to the modulators 4-7. The delays imparted by the delay units 8-10 are chosen so that the portion of the optical input signal at each modulator 4-7 at any instant corresponds to the same portion of successive ones of the four input channels. In this example, the input channels are equally spaced in the original multiplexed signal so that T=1/B seconds.

Conveniently the delay units 8 to 10 are constituted by different lengths of optical fibre.

The modulators 4-7 act as optical switches to connect periodically the incoming optical signals with respective regenerators 11-14. Clearly, if the modulators 4-7 are switched to connect the incoming signals with the regenerators 11-14 at a rate of B/4 bit/second then successive bits of the same channel will be applied to respective ones of the regenerators 11-14.

To achieve the correct sampling, the clock signal from the optical fibre regenerator 1 is fed along the line 2 to a ÷4 circuit 15 which generates a subsidiary clock signal having a frequency of B/4 Hz. This subsidiary clock signal is fed to a sampling circuit 16 which regenerates the clock signal at B/4Hz but with a pulse width of 1/B the pulse width of the original clock signal. This is applied simultaneously to the modulators 4-7 which pass samples of the incoming optical signals to the regenerators 11-14. The B/4 Hz subsidiary clock signal is applied simultaneously to the regenerators 11-14 which thus convert every fourth incoming sampled optical signal to its electrical equivalent.

The electrical signals are then fed to a marker detect and matrix switch circuit 17.

The original optical input signal carries additionally a marker or identification signal which typically could be a low level (few %), low frequency (kHz) modulation of a signal amplitude to identify one of the channels. This marker is extracted by the optical fibre regenerator 1 in a conventional manner and fed in electrical form to the marker detect and matrix switch circuit 17. The circuit 17 determines from the marker the identification of each of the four incoming channels. The circuit 17 then connects each of the incoming channels with a respective one of four line terminal equipment units (not shown).

Figure 2:
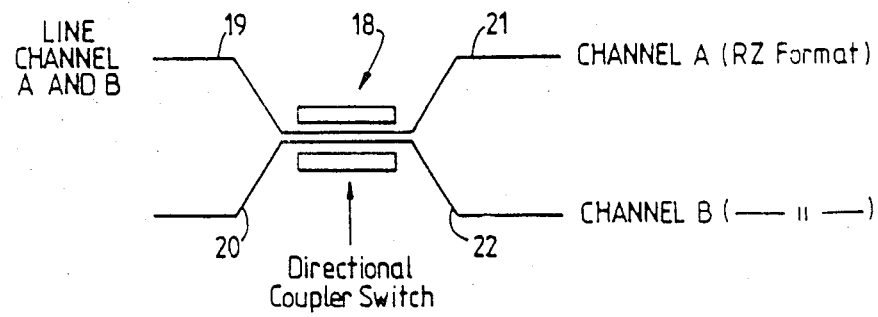
FIG. 2 is a schematic block diagram of a second example.

A second example of a system according to the invention is schematically illustrated in FIG. 2. The basic component of this system is an optical coupling switch 18 which has two input ports 19, 20 and two output ports 21, 22. The optical input signal is fed to the input port 19 of the coupling switch 18. The coupling switch may take up one of two states. In a first state the port 19 is connected to the port 21 (and the port 20 is connected to the port 22) and a second state in which the port 19 is connected to the port 22 (and the port 20 is connected to the port 21). A clock signal generator (not shown) controls the state of the coupling switch 18.

In its simplest form if the incoming optical signal comprises two channels multiplexed to give a bit rate of B bits/second, the clock signal generator causes the coupling switch 18 to switch between its two states at a frequency of B/2 Hz. In this way, one of the original channels is output from the port 21 and the other from the port 22.

In a more complex example, where for example the incoming optical signal carries four channels multiplexed to give a bit rate of B' bits/second, demultiplexing will take place in two stages. The optical signal will be fed to the coupling switch 18 as before, the coupling switch 18 being switched between its states at a frequency of B'/2 so that two of the incoming channels are output from the port 21 and the other two from the port 22. Each of the ports 21, 22 will then be connected with further respective coupling switches (not shown) which are switched between their two states at a frequency of B'/4 Hz to fully separate the channels. Clearly, this principle can be applied to any number of multiplexed channels.

The final output ports from the demultiplexer will then be connected to regenerators similar to those shown in FIG. 1 whose outputs are connected directly to respective line terminal equipment units.

In all these examples, the original multiplexed signal may be generated in any conventional manner or by systems similar to those described in our copending patent application Ser. No. 928,272 and entitled "Line Transmission Systems".

With these demultiplexing systems, multiplexed optical signals at very high bit rates for example up to 17 or 18 G bits/second can be demultiplexed.

I claim:

1. An optical demultiplexer for demultiplexing an n channel time division multiplexed optical input signal into n subsidiary optical signals, one corresponding to each of n channels comprising a clock signal generator for generating a clock signal with a frequency related to the bit rate of the optical input signal; n optical sampling devices; an optical splitter optically coupled with the optical sampling devices for feeding a portion of the optical input signal in parallel to each of the n sampling devices; and a control means responsive to the clock signal for regularly actuating each of the sampling devices to pass sample of the optical input signal comprising a respective one, only, of the subsidiary optical signals on a corresponding one of the n channels.

2. An optical demultiplexer according to claim 1, wherein the optical sampling means are actuated simultaneously and the optical splitter and the n optical sampling devices are optically coupled so as to impart a different delay to n−1 portions of the optical input signal, the delays being chosen such that a different one of the channels is sampled by each sampling device.

3. An optical demultiplexer as claimed in claim 2 in which the optical splitter is optically coupled to the optical sampling devices by optical waveguides of different lengths.

4. An optical demultiplexer as claimed in claim 3 in which the optical waveguides are optical fibres.

5. An optical demultiplexer as claimed in claim 1 in which the optical splitter and the n optical sampling devices are optically coupled so that the same channel arrives simultaneously at each optical sampling device, and the control means is arranged to actuate each optical sampling device to sample a respective one of the channels.

6. An optical demultiplexer according to any one of claims 1, 2, 3, 4, or 5 wherein the optical sampling devices comprise optical signal modulators.

7. An optical demultiplexer according to any one of claims 1, 2, 3, 4 or 5, further comprising n conversion means for converting the subsidiary optical signals into corresponding electrical signals, wherein the n conversion means are optically coupled to receive the subsidiary optical signals from respective one of the optical sampling devices.

8. An optical demultiplexer for demultiplexing an n channel time division multiplexed optical input signal into n subsidiary optical signals, one corresponding to each of n channels comprising a clock signal generator for generating a clock signal with a frequency related to the bit rate of the optical input signal; n optical sampling devices; an optical splitter optically coupled with the optical sampling devices for feeding a portion of the optical input signal in parallel to each of the n sampling devices; and a control means responsive to the clock signal for regularly actuating each of the sampling devices to pass a sample of the optical input signal comprising a respective one, only, of the subsidary optical signals on a corresponding one of the n channels, said demultiplexer further comprising n conversion means for converting the subsidiary optical signals into corresponding electrical signals wherein the n conversion means are optically coupled to receive the subsidiary optical signals from respective ones of the optical sampling devices, and wherein the clock signal generator feeds the clock signal to a divide-by-n circuit having an output connected with the conversion means.

* * * * *